United States Patent
Fabregas et al.

(10) Patent No.: US 8,736,469 B2
(45) Date of Patent: May 27, 2014

(54) METHOD AND SYSTEM FOR MINIMIZING VARIATION OF CONVERTER VOLTAGE REFERENCE

(71) Applicant: Lear Corporation, Southfield, MI (US)

(72) Inventors: Antoni Ferre Fabregas, Valls (ES); David Gamez Alari, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 13/675,046

(22) Filed: Nov. 13, 2012

(65) Prior Publication Data
US 2013/0154865 A1   Jun. 20, 2013

Related U.S. Application Data

(60) Provisional application No. 61/576,681, filed on Dec. 16, 2011.

(51) Int. Cl.
  *H03M 1/08*   (2006.01)
  *H03M 1/12*   (2006.01)
(52) U.S. Cl.
  CPC ............... *H03M 1/089* (2013.01); *H03M 1/12* (2013.01)
  USPC .......................................... 341/119; 341/155
(58) Field of Classification Search
  None
  See application file for complete search history.

(56) References Cited

U.S. PATENT DOCUMENTS

| | | | |
|---|---|---|---|
| 5,440,305 A * | 8/1995 | Signore et al. | 341/120 |
| 5,703,476 A | 12/1997 | Merlo et al. | |
| 7,030,791 B2 * | 4/2006 | Harada | 341/118 |
| 7,142,140 B2 * | 11/2006 | Storvik et al. | 341/141 |
| 7,501,804 B2 * | 3/2009 | Vo | 323/282 |
| 7,622,820 B1 * | 11/2009 | Prodic et al. | 307/31 |
| 7,898,451 B2 * | 3/2011 | Mouri et al. | 341/159 |
| 8,159,204 B2 * | 4/2012 | Grant | 323/285 |
| 2010/0033136 A1 | 2/2010 | Yang | |
| 2010/0309689 A1 | 12/2010 | Coulson | |

OTHER PUBLICATIONS

Neu, Thomas; Power-supply design for high-speed ADCs, SLYT366 Technical Brief, Texas Instruments Inc. Feb. 2010.*

* cited by examiner

*Primary Examiner* — Howard Williams
(74) *Attorney, Agent, or Firm* — Brooks Kushman P.C.

(57) ABSTRACT

A system for minimizing variation of a voltage reference includes a voltage reference generator and a power converter. The voltage reference generator is configured to generate a voltage reference from a supply voltage. The power converter, such as a flyback converter, is configured to supply an adjustable supply voltage to the voltage reference generator. The voltage reference generator generates the voltage reference from the adjustable supply voltage.

17 Claims, 2 Drawing Sheets

METHOD AND SYSTEM FOR MINIMIZING VARIATION OF CONVERTER VOLTAGE REFERENCE

CROSS-REFERENCE TO RELATED APPLICATIONS

This application claims the benefit of U.S. Provisional Application No. 61/576,681, filed Dec. 16, 2011; the disclosure of which is incorporated in its entirety by reference herein.

TECHNICAL FIELD

The present invention relates to converters, such as analog-to-digital converters, employing a voltage reference for converting an analog signal into a digital signal and vice versa.

BACKGROUND

Modern vehicles include systems having complex electric circuits for performing various functions. Common circuits include an analog-to-digital converter ("ADC") in communication with a sensor. The sensor measures a physical quantity and generates an electric analog signal indicative of the measured physical quantity. The analog sensor signal is typically a voltage signal (i.e., sensor input $V_{IN}$). The ADC converts the sensor input $V_{IN}$ into an electric digital signal by comparing the sensor input $V_{IN}$ with a voltage reference $V_{REF}$. The voltage reference $V_{REF}$ may be externally provided to the ADC or may be internally generated by the ADC. The voltage reference $V_{REF}$ is intended to be a precise 'yard stick' against which the sensor input $V_{IN}$ is compared. As such, the voltage reference $V_{REF}$ has to be precise in order for the ADC to accurately convert a given sensor input $V_{IN}$ into a digital signal.

SUMMARY

An object of the present invention includes minimizing variation of the voltage reference generated by a voltage reference generator for an analog-to-digital converter ("ADC") in which the variation of the voltage reference is minimized by modifying operating power supplied to the voltage reference generator as a function of variations in the power supply and/or variations in the operating temperature of the voltage reference generator.

In carrying out one or more of the above and other objects, the present invention provides a system for minimizing variation of a voltage reference. The system includes a voltage reference generator configured to generate a voltage reference from a supply voltage and a power converter configured to supply an adjustable supply voltage to the voltage reference generator. The voltage reference generator generates the voltage reference from the adjustable supply voltage.

The power converter is further configured to adjust the adjustable supply voltage to account for external variations which would otherwise cause the voltage reference generator to generate the voltage reference with corresponding variations.

In an embodiment, the power converter is a flyback converter.

The voltage reference generated by the voltage reference generator varies as a function of temperature variation of the voltage reference generator for a given supply voltage. The power converter is configured to adjust the adjustable supply voltage such that the voltage reference generated by the voltage reference generator does not vary in the presence of the temperature variation of the voltage reference generator.

The power converter is configured to convert an input voltage into the adjustable supply voltage and is further configured to adjust the adjustable supply voltage independent of variation of the input voltage. The voltage reference generated by the voltage reference generator varies as a function of variation of the supply voltage. The power converter is configured to maintain the adjustable supply voltage in the presence of variation of the input voltage such that the voltage reference generated by the voltage reference generator does not vary in the presence of the variation of the input voltage.

In an embodiment, the system further includes a controller. The controller is configured to select the adjustable supply voltage and control the power converter to supply the adjustable supply voltage. The controller may further be configured to monitor the adjustable supply voltage supplied from the power converter to the voltage reference generator in order to control the power converter to supply the adjustable supply voltage.

In an embodiment, the system further includes an analog/digital converter configured to receive the voltage reference from the voltage reference generator and generate an output signal based on an input signal and the voltage reference. The analog/digital converter is one of an analog-to-digital converter and a digital-to-analog converter. In an embodiment, the analog/digital converter is an analog-to-digital converter and the system further includes a sensor configured to generate a sensor signal indicative of a measured physical quantity. The sensor is further configured to provide the sensor signal to the analog-to-digital converter as the input signal.

Further, in carrying out one or more of the above and other objects, the present invention provides a method for minimizing variation of a voltage reference. The method includes generating by a power converter an adjustable supply voltage. The method further includes supplying the adjustable supply voltage from the power converter to a voltage reference generator configured to generate a voltage reference from a supply voltage. The method further includes generating by the voltage reference generator the voltage reference from the adjustable supply voltage.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
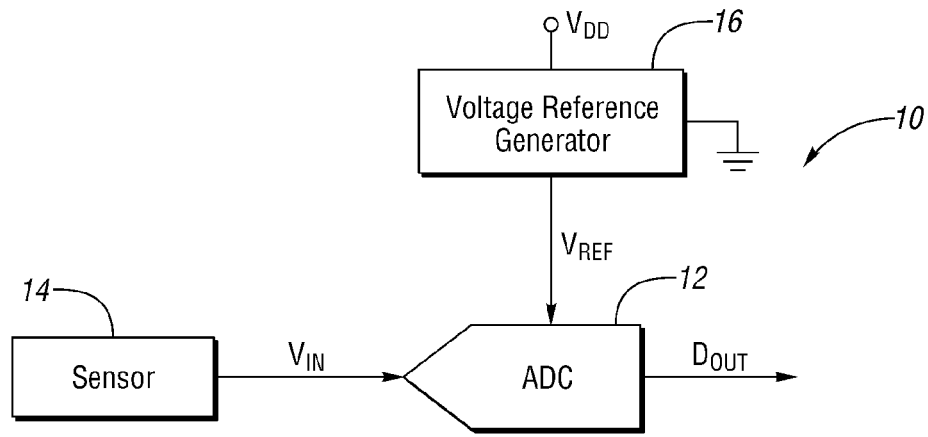
FIG. 1 illustrates a block diagram of a conventional system having an analog-to-digital converter ("ADC") and a voltage reference generator.

Referring now to FIG. 1, a block diagram of a conventional system 10 having an analog-to-digital converter ("ADC") 12 and a voltage reference generator 16 is shown. Conventional system 10 further includes a sensor 14. Sensor 14 is in communication with ADC 12. Sensor 14 is configured to measure a physical quantity and to generate an analog voltage signal indicative of the measured physical quantity.

The analog voltage signal generated by sensor 14 is provided to ADC 12 as a sensor input $V_{IN}$. ADC 12 converts the sensor input $V_{IN}$ into a digital electrical signal and outputs the digital electrical signal as a digital output code $D_{OUT}$. A controller or the like (not shown in FIG. 1) may use the digital output code $D_{OUT}$ for the sensor input $V_{IN}$ to control various functions.

Voltage reference generator 16 is configured to generate a voltage reference $V_{REF}$. Voltage reference generator 16 and ADC 12 are connected such that ADC 12 receives the voltage reference $V_{REF}$ from voltage reference generator 16. ADC 12 generates the digital output code $D_{OUT}$ for the sensor input $V_{IN}$ by comparing the sensor input $V_{IN}$ with the voltage reference $V_{REF}$.

The voltage reference $V_{REF}$ is intended to be a precise 'yard stick' against which the sensor input $V_{IN}$ is compared. Under error free operation, ADC 12 generates the digital output code $D_{OUT}$ for the sensor input $V_{IN}$ according to the following equation:

$$\text{output} = V_{IN} * (2^n / V_{REF})$$

where "output" is the digital output code $D_{OUT}$ in decimal form and "n" is the number of bits of resolution of the ADC. The resolution indicates the number of discrete values ADC 12 can produce over the range of analog values. The values are usually stored in binary form so the resolution is expressed in bits. For example, an ADC with a resolution of eight bits can encode the sensor input $V_{IN}$ to one in 256 different levels since $2^8=256$.

As shown in the above equation, the digital output code $D_{OUT}$ varies inversely proportional to the voltage reference $V_{REF}$. More significant to embodiments of the present invention, as described below, is that the digital output code $D_{OUT}$ is a function of the voltage reference $V_{REF}$. As such, the voltage reference $V_{REF}$ has to be precise in order for ADC 12 to output an accurate digital output code $D_{OUT}$ for a given sensor input $V_N$. If the voltage reference $V_{REF}$ is not accurate itself or is noisy, then it will degrade the accuracy of the digital output code $D_{OUT}$.

Voltage reference generator 16 receives a supply voltage $V_{DD}$ from a source such as a battery (not shown). Voltage reference generator 16 uses the supply voltage $V_{DD}$ in generating the voltage reference $V_{REF}$. A problem occurs when the supply voltage $V_{DD}$ experiences variations. This is a problem because voltage reference generator 16 will generate the voltage reference $V_{REF}$ with variations corresponding to the variations of the supply voltage $V_{DD}$. As indicated above, the voltage reference $V_{REF}$ is not accurate when it has such variations and will thereby degrade the accuracy of the resulting digital output code $D_{OUT}$ from ADC 12.

As described, variations in the supply voltage $V_{DD}$ cause voltage reference generator 16 to generate the voltage reference $V_{REF}$ with undesired variations. Further, temperature variations of voltage reference generator 16 also cause voltage reference generator 16 to generate the voltage reference $V_{REF}$ with undesired variations. Again, such variations in the voltage reference $V_{REF}$ correspond with the temperature variations and the accuracy of the resulting digital output code $D_{OUT}$ from ADC 12 will be degraded.

Figure 2:
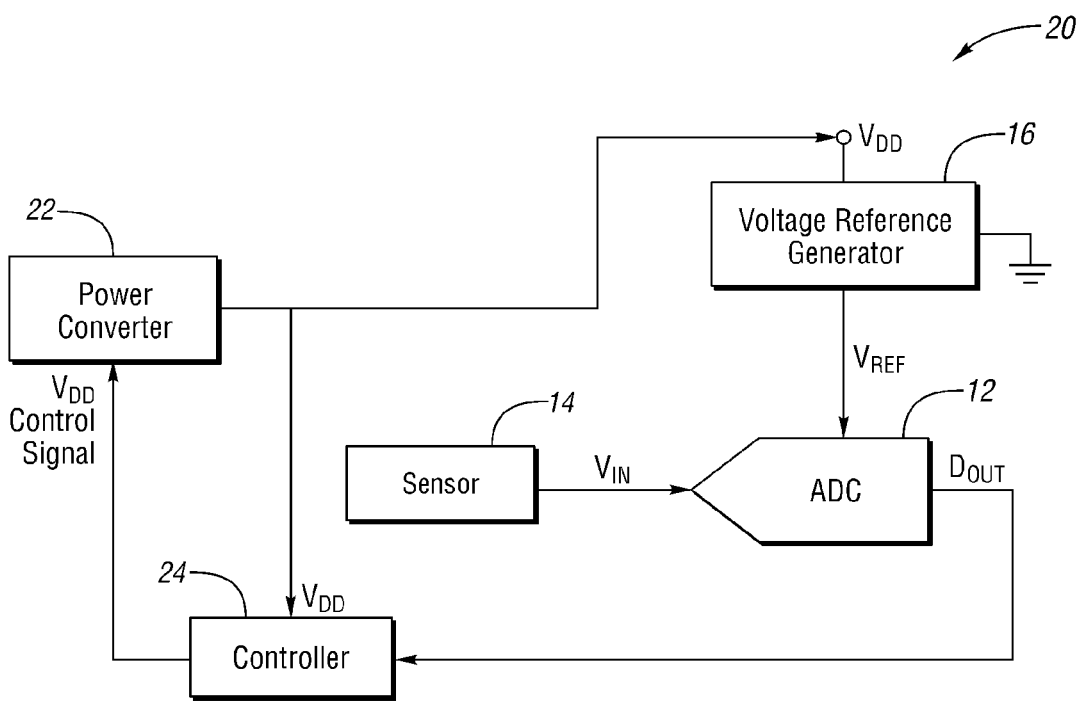
FIG. 2 illustrates a block diagram of a system having the ADC, the voltage reference generator, and a power converter as the power supply for the voltage reference generator in accordance with an embodiment of the present invention.

Referring now to FIG. 2, with continual reference to FIG. 1, a block diagram of a system 20 having ADC 12, voltage reference generator 16, and a power converter 22 as the power supply for voltage reference generator 16 in accordance with an embodiment of the present invention is shown. System 10 includes like components as conventional system 10 shown in FIG. 1 and such components are designated with the same reference numerals. System 20 generally differs from conventional system 10 in that system 20 includes a power converter 22 for providing the supply voltage $V_{DD}$ to voltage reference generator 16 in place of a conventional battery power supply or the like.

Power converter 22 is configured to provide a modifiable supply voltage $V_{DD}$ to voltage reference generator 16 instead of a fixed supply voltage $V_{DD}$ that is provided by a conventional battery supply or the like. Power converter 22 is configured to modify the supply voltage $V_{DD}$ in order to counteract variations in the power supply used by power converter 22 for its operation. The power supply used by power converter 22 may be a conventional battery supply or the like similar or the same as the power supply used by voltage reference generator 16 in conventional system 10 shown in FIG. 1. Likewise, power converter 22 is configured to modify the supply voltage $V_{DD}$ in order to counteract temperature variations of voltage reference generator 16.

As such, the supply voltage $V_{DD}$ from power converter 22 for voltage reference generator 16 can be modified as a function of variations in the power supply used by power converter 22 and variations in the temperature of voltage reference generator 16. As a result, the voltage reference $V_{REF}$ from voltage reference generator 16 is steady and without variations even while the power supply of power converter 22 experiences variations and/or while voltage reference generator 16 experiences temperature variations.

In this embodiment, power converter 22 is a flyback converter that is configured to convert an input voltage from battery power supply (e.g., a direct current ("DC") input voltage) at one level into a DC output voltage at another level. The magnitude of the output voltage may be greater than or less than the magnitude of the input voltage. Power converter 22 can regulate the output voltage to be held constant as the input voltage changes. For instance, power converter 22 can regulate the output voltage to be held constant as the input voltage declines due to a battery providing the input voltage partially draining. Likewise, power converter 22 can regulate the output voltage to vary in accordance with a desired modification while the input voltage remains constant or varies differently. For instance, power converter 22 may regulate the output voltage to vary in order to nullify temperature effects of voltage reference generator 16 as described above.

System 20 further includes a micro-controller ("controller") 24. Controller 24 is configured to control power converter 22 in order to regulate the output voltage provided by power converter 22. In particular, controller 24 controls power converter 22 to output as the output voltage the desired supply voltage $V_{DD}$. As shown in FIG. 2, the output of power converter 22 is connected to ADC 12 such that power converter 22 outputs the supply voltage $V_{DD}$ to ADC 12. In turn, ADC 12 uses the supply voltage $V_{DD}$ to generate the voltage reference $V_{REF}$ and converts the sensor input $V_{IN}$ into the digital output code $D_{OUT}$ as described above.

As shown in FIG. 2, the output of ADC 12 is connected to controller 24 such that controller 24 receives the digital output code $D_{OUT}$ for the sensor input $V_{IN}$ from ADC 12. Controller 24 generally uses the digital output code $D_{OUT}$ for the sensor input $V_{IN}$ to control various functions. For instance, in one embodiment, sensor 14 generates the sensor input $V_{IN}$ indicative of a measured physical quantity of a battery of an electric vehicle and controller 24 controls operation of the battery based on the corresponding digital output code $D_{OUT}$ for the sensor input $V_{IN}$.

Controller 24 employs a closed-loop configuration to control power converter 22 to output as the output voltage the desired supply voltage $V_{DD}$. In particular, controller 24 provides a $V_{DD}$ control signal to power converter 22 in order to control the level of the output voltage which is produced by power converter 22 and which is provided to voltage reference generator 16 as the supply voltage $V_{DD}$. The $V_{DD}$ control signal is indicative of a duty cycle that power converter 22 is to operate in order to generate the supply voltage $V_{DD}$. As will be described in greater detail below with reference to FIG. 3, power converter 22 is operable between opened and closed switch states. The output voltage of power converter 22 is generally a function of (i) the duty cycle at which operation of power converter 22 reverts between the opened and closed switch states and (ii) the input voltage. As such, controller 24 provides a $V_{DD}$ control signal indicative of a duty cycle that results in power converter 22 outputting as the output voltage the desired supply voltage $V_{DD}$ for voltage reference generator 16. The desired supply voltage $V_{DD}$ is the supply voltage required by voltage reference generator 16 to generate the voltage reference $V_{REF}$ without variations even during operating conditions in which the power supply of power converter 22 experiences variations and/or voltage reference generator 16 experiences temperature variations. As such, the desired supply voltage $V_{DD}$ can vary in correspondence with variations of the power supply of power converter 22 and/or the temperature of voltage reference generator 16.

As shown in FIG. 2, the output of power converter 22 is also connected to controller 24. As a result, controller 24 can directly monitor the output voltage of power converter 22 to determine if the output voltage is the desired supply voltage $V_{DD}$. In turn, controller 24 can adjust the duty cycle accordingly until the output voltage of power converter 22 has the same value as the desired supply voltage $V_{DD}$. In which case, power converter 22 is outputting as the output voltage the desired supply voltage $V_{DD}$ that is required by voltage reference generator 16 in order for voltage reference generator 16 to produce the voltage reference $V_{REF}$ without undesired variations.

Figure 3:
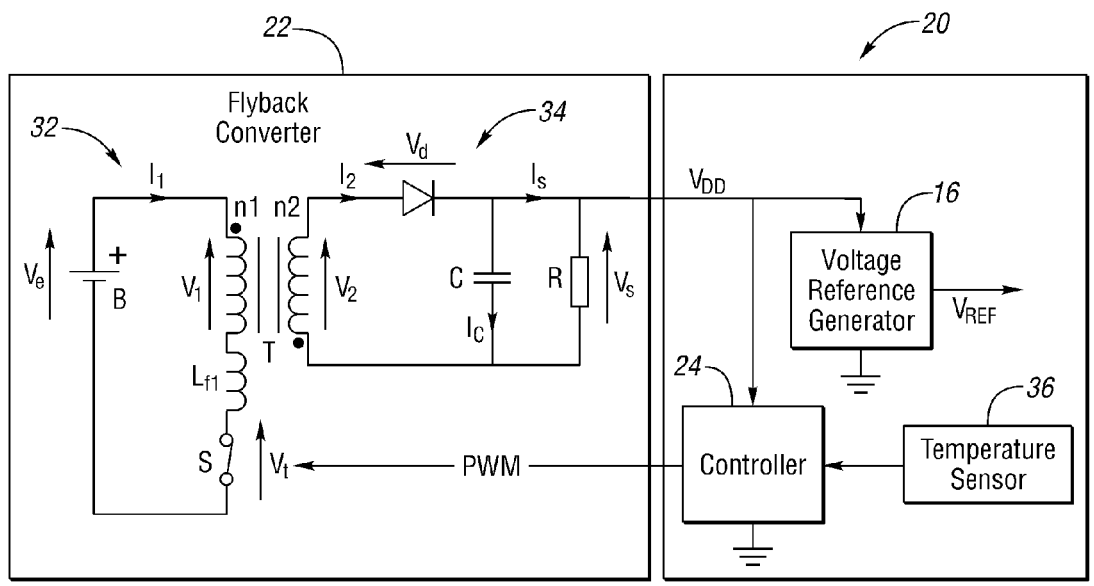
FIG. 3 illustrates a block diagram of the system shown in FIG. 2 having a detailed schematic diagram of the power converter.

Referring now to FIG. 3, with continual reference to FIG. 2, a block diagram of system 20 having a detailed schematic diagram of power converter 22 is shown. The detailed schematic diagram of power converter 22 in FIG. 3 is representative of a flyback converter.

A flyback converter is a type of buck-boost converter. A buck converter is a step-down converter in which the magnitude of the output voltage is less than the magnitude of the input voltage. A boost converter is a step-up converter in which the magnitude of the output voltage is greater than the magnitude of the input voltage.

As shown in the detailed schematic diagram of FIG. 3, flyback converter 22 includes two sub-circuits: an input sub-circuit 32 and an output sub-circuit 34. Input sub-circuit 32 includes an input voltage source such as a battery B and a switch S. Switch S is movable between closed and opened switch positions. Output sub-circuit 34 outputs the output voltage generated by flyback converter 22.

Input sub-circuit 32 and output sub-circuit 34 of flyback converter 22 are separated by an inductor that is split to form a transformer T. As such, flyback converter 22 is a buck-boost converter having the inductor split to form transformer T. As a result, the voltage ratios can be multiplied with an additional advantage of isolation. Further, the operating principle of flyback converter 22 is similar to the operating principle of a buck-boost converter.

Switch S is controllable by the control signal from controller 24 to switch between its closed and opened switch positions. In this regard, the control signal may be a pulse-width-modulated ("PWM") control signal as shown in FIG. 3. In this case, for example, when the pulse width is high the switch S is switched to the closed switch position and when the pulse width is low the switch S is switched to the opened switch position. Switching of the switch S between its closed and opened switch positions causes flyback converter 22 to revert between the opened and closed switch states. As such, controller 24 provides to switch S a PWM control signal having a duty cycle that results in flyback converter 22 outputting as the output voltage the desired supply voltage $V_{DD}$. Therefore, the PWM control signal from controller 24 works as $V_{DD}$ control signal.

As shown in FIG. 3, system 20 further includes a temperature sensor 36. Temperature sensor 36 is configured to monitor the temperature of voltage reference generator 16. Temperature sensor 36 may further be configured to monitor the temperature(s) of other components in system 20 such as ADC 12 and sensor 14. As described above, the supply voltage $V_{DD}$ from power converter 22 for voltage reference generator 16 may be modified to counteract temperature variations which would cause the voltage reference $V_{REF}$ to have corresponding variations if the supply voltage $V_{DD}$ remained fixed.

Figure 4:
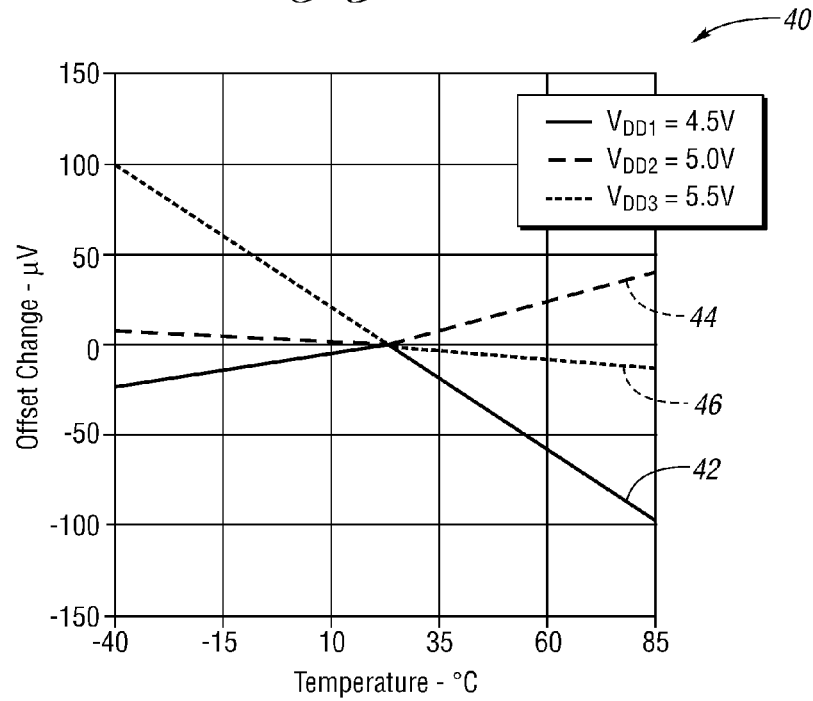
FIG. 4 illustrates a graph indicative of exemplary supply voltages $V_{DD}$ to be supplied to the voltage reference generator as a function of operating temperature of the voltage reference generator for the voltage reference generator to output a stable voltage reference $V_{REF}$.

Referring now to FIG. 4, a graph 40 indicative of exemplary supply voltages $V_{DD}$ to be supplied to voltage reference generator 16 as a function of operating temperature of voltage reference generator 16 for voltage reference generator 16 to output a stable voltage reference $V_{REF}$ is shown. Graph 40 includes plots 42, 44, 46 for three exemplary supply voltages: $V_{DD1}$=4.5V; $V_{DD2}$=5.0V; and $V_{DD3}$=5.5V. As can be seen in graph 40, each supply voltage $V_{DD}$ is to have an offset voltage change dependent on the temperature variation of voltage reference generator 16. Providing to voltage reference generator 16 the supply voltage $V_{DD}$ modified to account for the offset voltage change corresponding to the temperature of voltage reference generator 16 enables voltage reference generator 16 to output the voltage reference $V_{REF}$ without variations which would otherwise be present. As described above, power converter 22 is configured to produce such modifiable supply voltages $V_{DD}$.

As described herein, at least some embodiments of the present invention are directed to the concept of minimizing or reducing the variation of the voltage reference provided by a voltage reference generator to a converter such as an ADC. In this regard, the supply voltage supplied to the voltage reference generator for enabling the generation of the voltage reference is modified as a function of power supply and/or temperature variations. The modified supply voltage provided to the voltage reference generator causes the effects of the power supply and/or temperature variations to be nullified such that the voltage reference generator generates a stable and accurate voltage reference. Otherwise, if the supply voltage was not modified in such a manner, then the voltage reference generator would generate the voltage reference with variations corresponding to the power supply and/or temperature variations.

As further described herein, at least some embodiments of the present invention provide a method and system to minimize the variation of the voltage reference used in acquisition systems including high-voltage systems. The error by an ADC in converting an analog signal indicative of a measurement into a digital signal is directly proportional to the variation of the voltage reference. Since the voltage reference varies with temperature and power supply, by monitoring and/or controlling these two parameters it is possible to minimize the variation of the voltage reference and, therefore, reduce the error in the measurement. As described herein, in conventional systems, the supply voltage supplied to the voltage reference generator is fixed and, therefore, it cannot be changed. In at least some embodiments of the present invention, a power converter such as a flyback converter is used to supply the supply voltage. Since the power converter is isolated, its output voltage (i.e., the supply voltage supplied by the power converter) can be modified. Therefore, the supply voltage for the voltage reference generator can be changed depending on external conditions in order to minimize variation of the voltage reference generated by the voltage reference generator.

Other embodiments of the present invention provide an environment in which converter 12 is a digital-to-analog converter ("DAC") as opposed to being an ADC. A DAC functions opposite to an ADC in that a DAC converts a digital input signal into an analog output signal. A DAC also uses a voltage reference $V_{REF}$ in making this conversion. As such, just as with an ADC, the voltage reference $V_{REF}$ has to be precise in order for the conversion to be accurate.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A system for minimizing variation of a voltage reference for use by a converter, the system comprising:
    a voltage reference generator configured to generate a voltage reference from a supply voltage, wherein the voltage reference generated by the voltage reference generator varies as a function of temperature variation of the voltage reference generator for a given supply voltage;
    a power converter configured to supply an adjustable supply voltage to the voltage reference generator;
    wherein the voltage reference generator generates the voltage reference from the adjustable supply voltage;
    wherein the power converter is configured to adjust the adjustable supply voltage to account for the temperature variation of the voltage reference generator such that the voltage reference generated by the voltage reference generator does not vary in the presence of the temperature variation of the voltage reference generator; and
    an analog/digital converter configured to receive the voltage reference from the voltage reference generator and generate an output signal based on an input signal and the voltage reference from the voltage reference generator.

2. The system of claim 1 wherein:
the power converter is further configured to adjust the adjustable supply voltage to account for external variations which would otherwise cause the voltage reference generator to generate the voltage reference with corresponding variations.

3. The system of claim 1 wherein:
the power converter is a flyback converter.

4. The system of claim 1 wherein:
the power converter is configured to convert an input voltage into the adjustable supply voltage and is further configured to adjust the adjustable supply voltage independent of variation of the input voltage.

5. The system of claim 4 wherein:
the voltage reference generated by the voltage reference generator varies as a function of variation of the supply voltage;
wherein the power converter is configured to maintain the adjustable supply voltage in the presence of variation of the input voltage such that the voltage reference generated by the voltage reference generator does not vary in the presence of the variation of the input voltage.

6. The system of claim 1 further comprising:
a controller, wherein the controller is configured to select the adjustable supply voltage and control the power converter to supply the adjustable supply voltage.

7. The system of claim 6 wherein:
the controller monitors the adjustable supply voltage supplied from the power converter to the voltage reference generator in order to control the power converter to supply the adjustable supply voltage.

8. The system of claim 1 wherein:
the analog/digital converter is one of an analog-to-digital converter and a digital-to-analog converter.

9. The system of claim 8 wherein the analog/digital converter is the analog-to-digital converter, the system further comprising:
a sensor configured to generate a sensor signal indicative of a measured physical quantity, wherein the sensor is further configured to provide the sensor signal to the analog-to-digital converter as the input signal.

10. A method for minimizing variation of a voltage reference for use by a converter, the method comprising:
    generating by a power converter an adjustable supply voltage;
    supplying the adjustable supply voltage from the power converter to a voltage reference generator configured to generate a voltage reference from a supply voltage;
    generating by the voltage reference generator the voltage reference from the adjustable supply voltage, wherein the voltage reference generated by the voltage reference generator varies as a function of temperature variation of the voltage reference generator for a given supply voltage;
    adjusting by the power converter the adjustable supply voltage to account for the temperature variation of the voltage reference generator such that the voltage reference generated by the voltage reference generator does not vary in the presence of the temperature variation of the voltage reference generator;
    receiving by an analog-to-digital converter the voltage reference from the voltage reference generator; and
    generating by the analog-to-digital converter an output signal based on an input signal and the voltage reference from the voltage reference generator.

11. The method of claim 10 further comprising:
converting by the power converter an input voltage into the adjustable supply voltage such that adjustment of the adjustable supply voltage is independent of variation of the input voltage.

12. The method of claim 10 wherein the voltage reference generated by the voltage reference generator varies as a function of variation of the supply voltage, the method further comprising:
   maintaining by the power converter the adjustable supply voltage in the presence of variation of the input voltage such that the voltage reference generated by the voltage reference generator does not vary in the presence of the variation of the input voltage.

13. The method of claim 10 further comprising:
selecting by a controller the adjustable supply voltage; and
controlling by the controller the power converter to supply the adjustable supply voltage.

14. The method of claim 13 further comprising:
monitoring by the controller the adjustable supply voltage supplied from the power converter to the voltage reference generator in order to control the power converter to supply the adjustable supply voltage.

15. The method of claim 10 further comprising:
generating a sensor signal indicative of a measured physical quantity; and
providing the sensor signal to the analog-to-digital converter as the input signal.

16. The method of claim 10 further comprising:
adjusting by the power converter the adjustable supply voltage to account for external variations which would otherwise cause the voltage reference generator to generate the voltage reference with corresponding variations.

17. The method of claim 10 wherein:
the power converter is a flyback converter.

* * * * *